United States Patent [19]

Holbrook et al.

[11] 4,352,031
[45] Sep. 28, 1982

[54] PRECHARGE CIRCUIT

[75] Inventors: Mark D. Holbrook, Ringoes; William K. Knapp, Belle Mead, both of N.J.

[73] Assignee: RCA Corporation, New York, N.Y.

[21] Appl. No.: 143,025

[22] Filed: Apr. 23, 1980

[51] Int. Cl.[3] .................. H03K 19/08; H01L 27/02
[52] U.S. Cl. ..................................... 307/444; 357/45
[58] Field of Search ............... 307/440, 444, 448, 450, 307/451, 449, 468, 238.1, 238.8; 365/63, 72; 357/41, 45

[56] References Cited

U.S. PATENT DOCUMENTS 3,551,693 12/1970 Burns ................................. 307/448
4,107,548 8/1978 Sakaba et al. ..................... 307/450

Primary Examiner—James W. Davie
Attorney, Agent, or Firm—Samuel Cohen; Henry I. Schanzer

[57] ABSTRACT

Improved precharge circuit for a dynamic circuit having N, spaced apart, outputs; where N is an integer greater than 2. The conduction path of a precharge transistor is connected between each pair of outputs, whereby (N-1) precharge transistors are connected end-to-end between the N output points. At least one additional precharge transistor is connected between one of the N outputs and a precharge potential point. A common conductor interconnects the control electrodes of all the precharge transistors for, selectively, turning them on concurrently and distributing the precharge potential to all of the N outputs. The end-to-end connection of the N-1 transistors enables the conduction paths of the N-1 transistors and the common conductor to be formed orthogonally to output line conductors connected to the N outputs, thereby enabling the manufacture of a dense and compact circuit.

9 Claims, 6 Drawing Figures

PRECHARGE CIRCUIT

This invention relates to logic circuits and, in particular, to a high density dynamic logic circuit.

In the accompanying drawing like reference characters denote like components; and FIG. 1 is a schematic diagram of a prior art dynamic read only memory (ROM);

Figure 4:
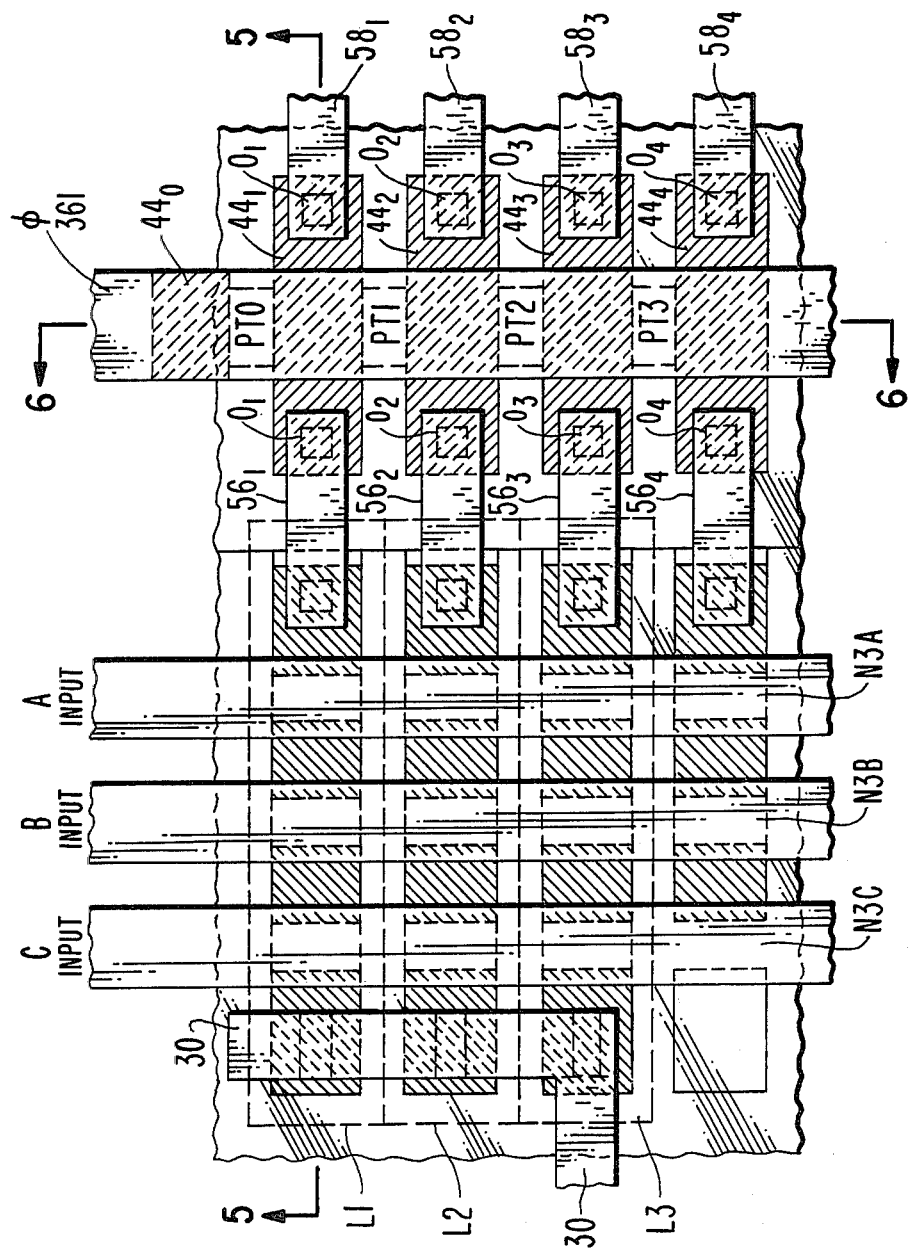
FIG. 4 is a diagram of the layout of a portion of the circuit of FIG. 3.
Figure 5:
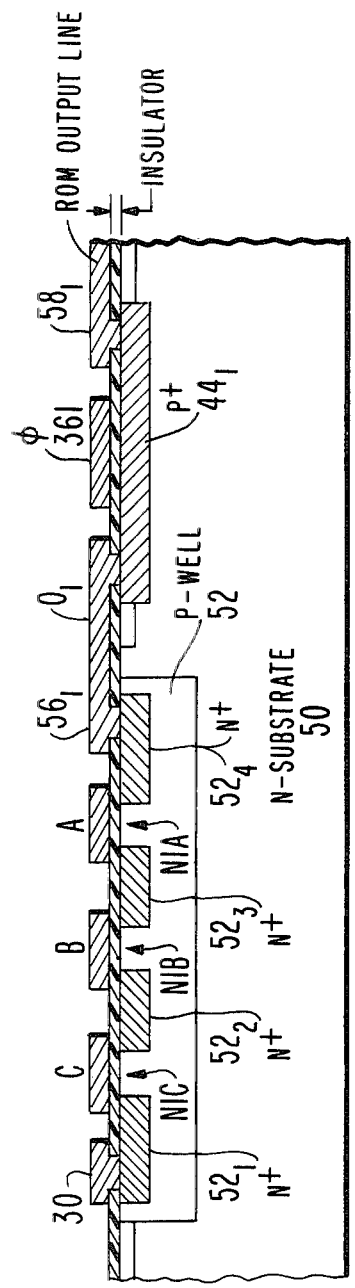
Figure 6:
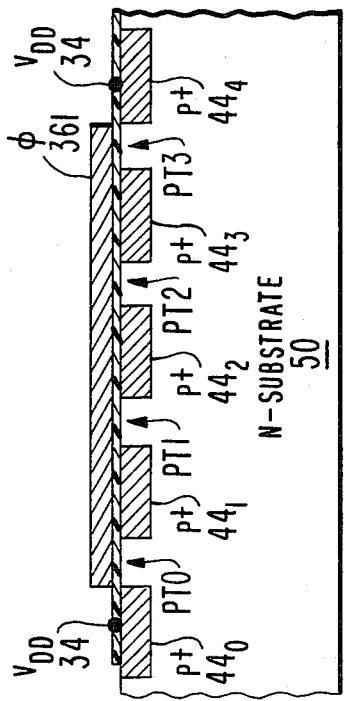

FIGS. 5 and 6 are cross-sectional diagrams taken along lines 5—5 and 6—6, respectively, of FIG. 4.

In the design of integrated circuits (IC's) it is important to maximize the packing density, that is, to include as large as possible a number of circuit elements in a given unit area. This reduces the cost and power dissipation in the IC and is generally advantageous.

Unfortunately, there are many constraints which limit the extent to which the packing density can be increased. One is the particular circuit configuration employed. This may be illustrated by referring to the prior art read-only memory (ROM) circuit shown in FIG. 1. It includes three strings of transistors (L1, L2, and L3) each string comprising 3 transistors of N conductivity type whose conduction paths are connected in series between an output terminal ($O_1$, $O_2$, $O_3$) and common point 30. Input signals indicative of binary variables (A, B and C) are applied to the gate electrodes of the transistors in each string. Programming of the ROM is accomplished by shorting out, in each string, those transistors corresponding to unwanted input variables (for example, note that one transistor is shorted in L2 and two are shorted in L3). Conduction through the strings may be prevented by turning off transistor, $N_S$, whose conduction path is connected between terminal 30 and a ground terminal.

A precharge transistor (P1, P2, P3) is connected between each output terminal ($O_1$, $O_2$, $O_3$) and a point of fixed potential, $V_{DD}$. A precharge signal, $\phi$, is applied to the gate electrodes of the precharge transistors and to the gate electrode of $N_S$. When the precharge signal is low, $N_S$ is turned-off while the precharge transistors (P1, P2, and P3) are turned on. This causes the output terminals to be precharged to $V_{DD}$ volts, and no current is conducted through any of the series strings as $N_S$ is turned-off. Subsequently, when the precharge signal goes high ($V_{DD}$), $N_S$ is turned on while the precharge transistors are turned off. The strings of transistors are then connected in circuit between an output terminal and ground potential and produce at their respective outputs a signal which is the NAND function of the input variables (A, B, or C) applied to the gate electrodes of the non-shorted transistors of each string.

Figure 1:
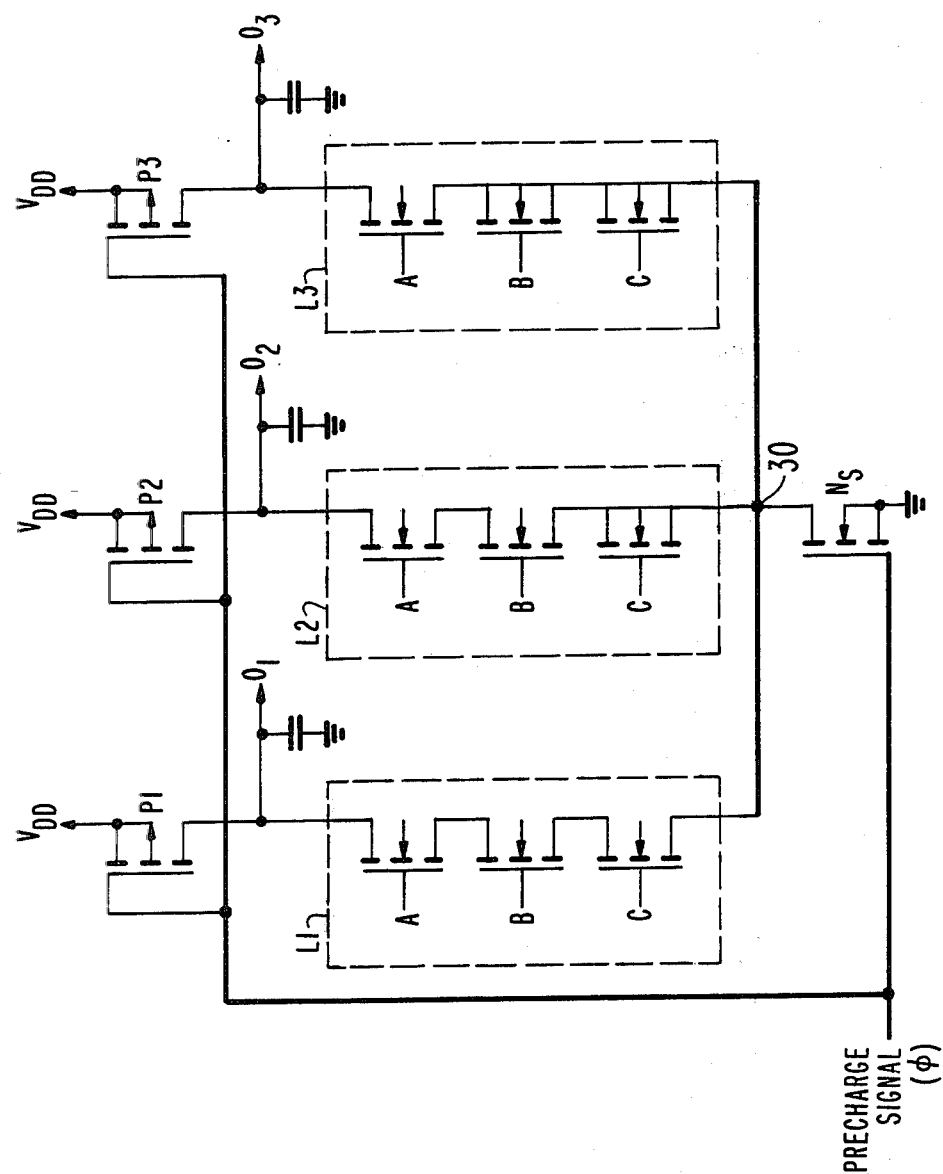
Figure 2:
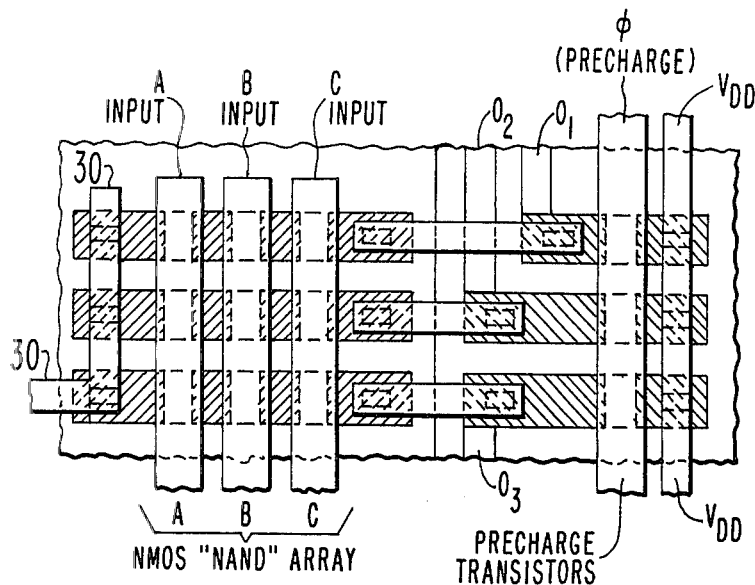
FIG. 2 is a diagram of a typical layout of the circuit of FIG. 1.

The circuit of FIG. 1 has many distinctive features but its layout is a problem as illustrated in FIG. 2. The strings of the series connected transistors lay out in a very compact manner; but the precharge transistors and the connections for accessing each output cannot be formed in line (on pitch) with the series string.

Where, as in FIG. 2, the precharge transistors are formed in line with the string of transistors, the outputs have to be brought (tunnelled) out to an area outside of the area dedicated to the precharge transistors. Much chip area is then wasted to bring out the necessary output lines or tunnels.

Alternatively, each output line could be formed and routed in line (on pitch) with the series strings of transistors. However, the precharge transistors then have to be located outside of the output lines area and the precharge signal then has to be routed to each precharge transistor. Such a layout is wasteful of space and is not neat and compact.

The problem present in laying out the prior art circuit is overcome in circuits embodying the invention by connecting precharge transistors between adjacent outputs. Thus, in a circuit having N spaced apart outputs, N-1 precharge transistors have their conduction paths connected end-to-end between the N outputs in a perpendicular direction to the N output lines with each transistor being connected between two adjacent outputs. The conductor distributing the precharge signal to the gate electrodes of the precharge transistor is formed over, and parallel to, their conduction paths in a direction orthogonal to the output lines. A compact, high density, circuit may then be formed. This is discussed in more detail below.

Figure 3:
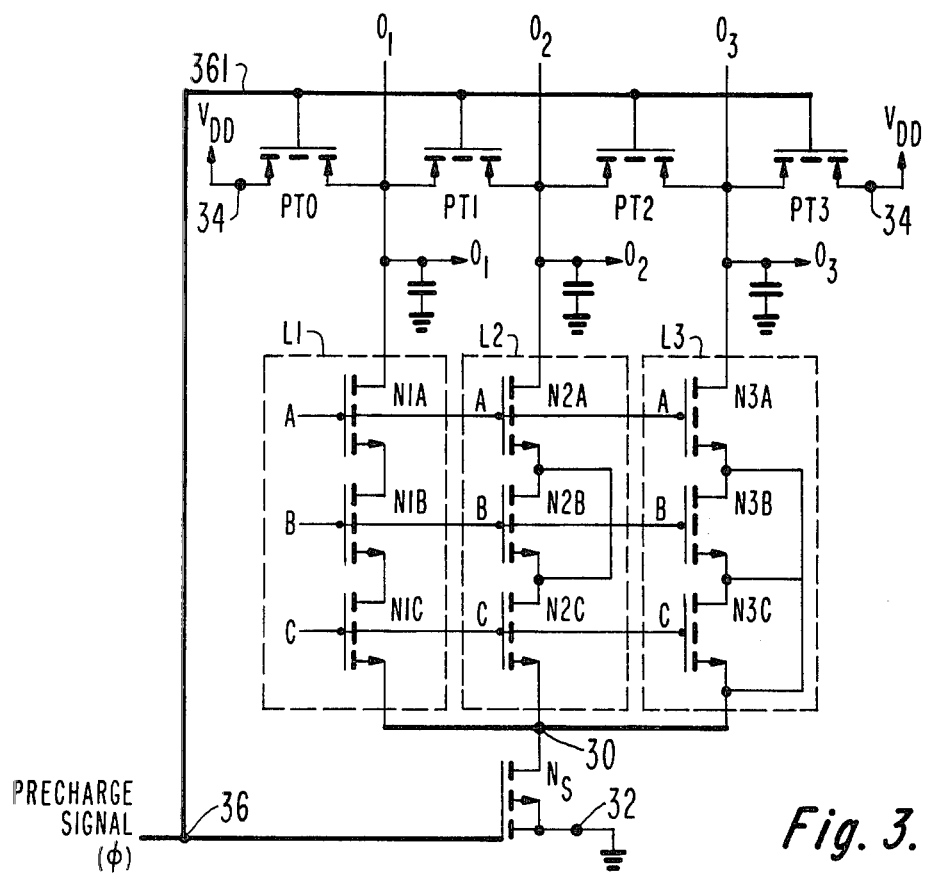
FIG. 3 is a schematic diagram of a circuit embodying the invention.

The circuit of FIG. 3 includes three logic circuits (L1, L2, and L3), similar to the type shown in FIG. 1, each circuit being connected between an output line or point ($O_1$, $O_2$, $O_3$) and a common point 30. Each one of the logic circuits (L1, L2, L3) includes a string (Li) of 3 rows of transistors (NiA, NiB, and NiC) of N-conductivity type having their conduction paths connected in series between an output terminal $O_i$ and common point 30. In FIG. 3 three strings and three transistors per string are shown; but it should be evident that more than 3 strings (columns) of elements could be used and more than 3 rows of transistors could be connected in series. Three input signal variables (A, B and C), one variable per row of transistors, are applied to the gate electrodes of the transistors of each string. Thus, each transistor of a string has applied to it a different one of the three input variables. As in the circuit of FIG. 1, there are shorted out, in each string, those transistors corresponding to unwanted input variables. This is done, for example, by filling the channel region of the transistor whose function is not desired with N+ dopants, thereby shorting together its source and drain regions. In FIG. 3, by way of example, L1 has transistors N1A, N1B and N1C, actively connected in circuit; L2 has transistors N2A and N2C actively connected in circuit with N2B shorted out; and L3 has N3A actively connected in circuit with N3B and N3C shorted out. The conduction path of a switching transistor $N_S$ which is used to control the conductivity of the strings is connected between the common point 30 and a terminal 32 to which is applied ground potential.

The structure of the circuit of FIG. 3 differs from that of FIG. 1 in the interconnection of the precharge transistors. In FIG. 3 the output points ($O_1$, $O_2$, $O_3$) are selectively precharged by means of precharge transistors $PT_0$, $PT_1$, $PT_2$, and $PT_3$. Each one of the "internal" precharge transistors ($PT_1$ and $PT_2$) has its conduction path connected between two outputs points ($O_1$ and $O_2$; $O_2$ and $O_3$) while the two "external" transistors ($PT_0$ and $PT_3$) have their conduction paths connected between an output point ($O_1$ and $O_3$) and a line 34 to which is applied $V_{DD}$ volts. The gate electrodes of the precharge transistors and the gate electrode of transistor $N_S$ are connected via a conductor 361 to a terminal 36, to which is applied a precharge signal, $\phi$.

In the operation of the circuit, a "low" (0 volts) precharge signal applied to terminal 36 turns off transistor $N_S$ preventing current flow through any of the strings (L1, L2, L3). Concurrently, the "external" precharge transistors ($PT_0$ and $PT_3$) couple the $V_{DD}$ volts present at their source electrodes to the internal nodes ($O_1$ and $O_3$) connected to their drain electrodes. The remaining "internal" precharge transistors ($PT_1$, $PT_2$) function to distribute the $V_{DD}$ volts to the two terminals between which they are connected. As a result, all the output terminals ($O_1$, $O_2$ ... $O_3$) get charged to, or close to, $V_{DD}$ volts by the precharge transistors. In the circuit of FIG. 3, four (i.e. N+1) precharge transistors are shown for three (i.e. N) output terminals; (where N is an integer). But, it should be evident that only one transistor is needed to couple $V_{DD}$ to one of the output terminals while the remaining "internal" precharge transistors distribute the potential between the remaining output terminals. Thus, only N transistors are necessary (i.e. $PT_0$, $PT_1$, and $PT_2$; or $PT_1$, $PT_2$ and $PT_3$). Using an extra precharge transistor, (four precharge transistors are shown in FIG. 3) enables the precharge voltage to be distributed more quickly. Also, the "external" transistors ($PT_0$ and $PT_3$) are shown connected between an "end" output terminal ($O_1$, $O_3$) and $V_{DD}$. But, it should be evident than an "external" precharge transistor can be connected between any of the output terminals and the $V_{DD}$ line.

Following the precharge of the output terminals ($O_1$, $O_2$, $O_3$) to $V_{DD}$, the precharge signal is driven high ($V_{DD}$ volts) turning off all the precharge transistors and turning on $N_S$. $N_S$ is a relatively large device and functions to clamp node 30 to, or close to, ground potential via a low impedance conduction path. With transistor $N_S$ turned on, the logic function produced at the output terminals $O_1$, $O_2$ and $O_3$ will depend on the structure of logic circuits L1, L2 and L3 and on the value of the signals A, B and C. Whenever an input signal (A, B, or C) is high, the N transistors to which that input variable is applied are turned-on.

For the configuration of FIG. 3, when transistor $N_S$ is turned on, the precharge transistors are turned-off and when the input variables A, B and C are applied, the following outputs are produced:

(a) at $O_a$ a signal equal to the NAND function of A, B and C, ... [$O_1 = \overline{A.B.C}$];

(b) at $O_2$ a signal equal to the NAND function of A and C, ... [$O_2 = \overline{A.C}$]; and (c) at $O_3$ a signal equal to the inverse of A, ... [$O_3 = \overline{A}$].

Thus, following precharge of the output terminals to $V_{DD}$, $O_1$ will be driven low only when signals A, B and C are high; $O_2$ will be driven low only when both A and C are high; and $O_3$ will be driven low whenever the signal A is high.

The significance of the precharge transistor interconnection is best appreciated by referring to the layout diagram of FIG. 4 and comparing it to FIG. 2. As in FIG. 2, the series strings of transistors forming circuits L1, L2, and L3 can be laid out in line (on pitch) and form a very compact arrangement. Each string need only be one transistor wide, and one string can be formed in very close proximity to another. In FIG. 4, in sharp contrast to the prior art showing of FIG. 2, the output ($O_i$) from each string is brought out (shown in the horizontal direction) via a conductor $56_i$ to a diffused region $44_i$ which is connected to an output conductor $58_i$, all being in line and on pitch with the string.

The source/drain regions of the "internal" precharge transistors are formed by the diffused regions $44_i$ which are part of the output lines, and their conduction paths extend between the output lines. Thus, the conduction path of each internal precharge transistor lies between two output lines. Overlying and parallel to the conduction paths of the precharge transistors is conductor $36_1$ which functions as the gate electrode of the precharge transistors and as the means for distributing the precharge signal, $\phi$, to their gate electrodes.

The construction of the circuit of FIG. 4 is further detailed in the cross sectional diagram of FIG. 5. The circuit includes an N-substrate 50 in which is formed a P-well 52. Located in P-well 52 are regions $52_1$, $52_2$, $52_3$, and $52_4$ of N+ conductivity type which may be diffused regions and which form the sources and drains of N-type transistors N1A, N1B, and N1C, as follows. Region $52_i$ from the source of N1C and is connected via conductor 30 to the drain of transistor $N_S$. Region $52_2$ forms the drain of N1C and the source of N1B. Regions $52_3$ forms the drain of N1B and the source of N1A and region $52_4$ forms the drain of transistor N1A. The drain of N1A which defines output $O_1$ is connected via a conductor, $56_1$, which may be metal or some other suitable conductive material to a P+ region $44_i$, diffused within substrate 50. P+ region $44_i$, functions both as a tunnel or path to bring out the output signal to an output line 58, and as the source or drain of a precharge transistor.

The P+ region $44_i$, extends underneath a runway over which conductor $36_1$ is routed. Conductor $36_1$ overlies but is electrically isolated from region $44_i$. Conductor $58_1$ which defines the output line of output $O_1$ contacts the end of the P+ region $44_i$ removed from conductor $56_1$ and forms an output line suitable for connection to another dense and compact circuit.

The precharge transistors may be formed as shown in the cross-sectional diagram of FIG. 6. The source/drain regions (e.g. $44_0$, $44_1$, $44_2$, $44_3$, and $44_4$) of the precharge transistors are formed by regions of P+ conductivity diffused in substrate 50. Overlying the diffused regions but electrically isolated therefrom is the conductor $36_1$ to which is applied the precharge signal $\phi$. The end regions $44_0$ and $44_4$ have $+V_{DD}$ applied to them. Whenever $\phi$ goes low a conduction path is formed between the drain/source regions of all the precharge transistors causing a conduction path to extend from region $44_0$ to region $44_4$, whereby $V_{DD}$ is distributed along the conduction channels charging all the output lines at, or close to, $V_{DD}$.

Referring back to FIG. 4, it is evident that an improved precharge circuit is formed such that the output lines of the array are brought out in line (in the horizontal direction) with the series transistors of the strings (L1, L2, L3) and that each circuit and its output line can be placed on pitch with and very close to a preceeding circuit and line. Each circuit need only be one transistor wide and there is no need to leave extra spaces between the strings to accommodate the precharge circuitry, since the precharge transistors are formed between adjacent output lines. Thus, as shown in FIGS. 4, 5, and 6, the precharge transistors are formed in an orthogonal direction to the outputs (the output lines) and the conductor controlling the conductivity of the precharge transistor is also formed overlying, and in parallel to, the conduction paths of the precharge transistors and also in an orthogonal direction to the output lines of the series string transistors.

An important feature of the layout of FIG. 4 compared to that of the prior art circuit shown in FIG. 2 is the substantial increase in packing density which is possible. In FIG. 2 space must be alotted between the output of the logic circuit section and the precharge transistors for a number not less than N/2 side-by-side lines, where N is the number of ouputs (three in this example). As can be seen in FIG. 2, $O_2$ and $O_3$ are aligned and occupy one line width and $O_1$ requires a second line. Thus, if W is the width of a line plus the width of the adjacent insulation between that line and the adjacent line, then the circuit of FIG. 2 requires a space 2W wide between the logic circuit and the precharge transistors, whereas the circuit of FIG. 4 requires a space which need be only of some reference width which is considerably smaller than 2W and which, for purpose of this example may be assumed to be W. This may not appear too significant in FIG. 2 which, for ease of description, shows a circuit with only three outputs. However, for the more typical case involving a circuit with considerably more outputs, the saving is much greater. For example, if the FIG. 2 circuit had ten strings of transistors (ten outputs), the output lines, if they were symmetrically arranged, divided into two groups, and run toward opposite edges of the chips, would require a space 5W wide whereas with the FIG. 4 circuit the output lines would still require a space of reference width, assumed to be W. The invention, in which the output lines are brought out in line (on pitch) as illustrated by the layout of FIG. 4, results in a substantial saving in chip area, with savings increasing as the number of outputs increase.

What is claimed is:

1. In combination with N separate circuits, where N is an integer greater than 2, each circuit being connected between a different one of N output points and a common point, animproved precharge circuit for selectively and concurrently placing said N output points at, or close to, a selected operating potential, comprising:
   N-1 transistors, each transistor having a conduction path and a control electrode;
   means connecting the conductin paths of each one of said N-1 transistors between two, different ones, of said N output points, whereby the conduction paths of said N-1 transistors are connected end-to-end in series;
   an additional transistor having its conduction path connected between one of said N output points and a point of operating potential; and
   means connected to the control electrodes of said N-1 transistors and to the control electrode of said additional transistor for selectively turning them on concurrently and distributing the potential at said point of operating potential to said N output points.

2. The combination as claimed in claim 1 wherein said N separate circuits are formed on an integrated circuit, each one of said N output points being spaced apart on said integrated circuit, and wherein the conduction path of each one of said N-1 transistors is formed between a different pair of said N output points.

3. The combination as claimed in claim 2 wherein said N separate circuits are formed by and include transistors of one conductivity type;
   further including a control transistor of said one conductivity type having its conduction path connected between said common point and a point of reference potential; and
   wherein said N-1 transistors and said additional transistor are of opposite conductivity type to said one conductivity type.

4. The combination as claimed in claim 3 further including means for selectively and concurrently turning off said control transistor when said precharge transistors are turned-on and turning-on said control transistor when said precharge transistors are turned off.

5. An integrated field-effect transistor circuit comprising:
   a semiconductor body of first conductivity type;
   X logic circuits formed in said body, each logic circuit having an output and comprising a plurality of transistors, each transistor having a conduction path and a control electrode, the conduction paths of the transistors of each one of said X logic circuits being connected in circuit between its output and a common line, where X is an integer greater than 2;
   X spaced apart output lines, one line per output, each line being physically displaced from its corresponding output, said lines being of conductive material and being isolated from and overlying said semiconductor body and extending in a first direction;
   X spaced apart regions of second conductivity type; each one of said X regions being formed in said body between a different one of said outputs and a different one of said output lines, each one of said X spaced apart regions being connected at one end to its corresponding output and at its other end to its corresponding output line for providing a continuous signal propagation path between its corresponding output and its corresponding output line along said first direction, and said X spaced apart regions forming the source and drain regions of precharge transistors whose conduction paths are in a direction orthogonal to said first direction;
   a conductor isolated from and overlying said X regions extending in a direction orthogonal to said first direction for forming the control electrodes of said precharge transistors;
   means for applying a predetermined potential, in reference to said body, to one of said X spaced apart regions; and
   means for applying a signal to said conductor for selectively causing conduction between said X regions and placing said X regions and their conduction paths at said predetermined potential for a selected period of time.

6. The combination as claimed in claim 5 wherein said semiconductor body is a substrate of said first conductivity type;
   wherein said first and second conductivity types are complementary to each other;
   wherein the transistors of said X logic circuits are formed in a well-region of said second conductivity type formed in said body;
   said transistors of said X logic circuits having source and drain regions of first conductivity type formed in said well-region, said logic transistors being of said first conductivity type; and
   wherein said precharge transistors are transistors of second conductivity type.

7. The combination as claimed in claim 6 wherein the conduction paths of the transistors of each one of said X logic circuits are connected in series between its output and said common line, and wherein the conduction paths of the transistors of each one of said X logic circuits is in line with its corresponding one of said X spaced apart region and its corresponding output line.

8. The combination as claimed in claim 6 further including means coupled to said X logic circuits for preventing the flow of direct current through the transistors in said X logic circuits when said precharge transistors are turned on.

9. An integrated circuit comprising:
a substrate of one conductivity type;
a plurality of X integrated circuits, each terminating in a first output region, respectively, said first output regions being spaced from one another along a line extending in a column direction, where X is an integer greater than 2;
X second output regions, one second output region per first output region, each one of said second output regions being formed in said substrate and being of opposite conductivity type to the conductivity of said substrate, each one of said second output regions being spaced apart from its corresponding first region, in a row direction which is orthogonal to said column direction, said second output regions being spaced apart from one another along a line extending in said column direction, each said second output region serving as at least one of the source and drain regions of a group of transistors and pairs of adjacent ones of said second output regions serving as the source and drain regions, respectively, of the transistors of said group;
a common conductor serving as the common gate electrode of all the transistors of said group, said conductor being insulated from the substrate and extending in said first column direction over said second output regions; and
X conductors each joining a first output region to its corresponding second output region in the same row, said X second output regions also serving as X circuit output points.

* * * * *

UNITED STATES PATENT AND TRADEMARK OFFICE
CERTIFICATE OF CORRECTION

PATENT NO. : 4,352,031

DATED : September 28, 1982

INVENTOR(S) : Mark Denton Holbrook et al.

It is certified that error appears in the above-identified patent and that said Letters Patent is hereby corrected as shown below:

Column 1, line 32, before "common" insert -- a --.

Column 3, line 45, "$O_a$" should read -- $O_1$ --.

Column 4, line 18, "$52_i$" should read -- $52_1$ --.

Column 5, line 38, "animproved" should read -- an improved --.

Signed and Sealed this

Fifteenth Day of March 1983

[SEAL]

Attest:

GERALD J. MOSSINGHOFF

Attesting Officer

Commissioner of Patents and Trademarks